United States Patent

[11] 3,631,313

[72] Inventor Gordon E. Moore
Los Altos Hills, Calif.

[21] Appl. No. 874,529
[22] Filed Nov. 6, 1969
[45] Patented Dec. 28, 1971
[73] Assignee Intel Corporation
Mountain View, Calif.

[54] RESISTOR FOR INTEGRATED CIRCUIT
9 Claims, 9 Drawing Figs.

[52] U.S. Cl. .......... 317/235, 317/235 D, 317/235 E, 317/235 AM
[51] Int. Cl. .......... H01l 19/00
[50] Field of Search .......... 307/303; 317/235 D, 235 E, 235 AM

[56] References Cited

UNITED STATES PATENTS

| | | | |
|---|---|---|---|
| 3,569,800 | 3/1971 | Collins | 317/235 |
| 3,573,573 | 4/1971 | Moore | 317/235 |
| 3,244,950 | 4/1966 | Ferguson | 317/235 |
| 3,253,197 | 5/1966 | Haas | 317/235 |
| 3,518,510 | 6/1970 | Lamming | 317/235 |

OTHER REFERENCES

IBM Tech. Discl. Bull. Vol. 9, No. 2, pp. 195- 196; Regh, " Fabrication of Two Surface Devices" July 66

IBM Tech. Discl. Bull. Vol. 11, No. 8, p. 918; Wu, " Current Switch Emitter-Follower Connection" (Jan. 69)

IBM Tech. Discl. Bull. Vol. 11, No. 11, p. 1390; Geller, " Semiconductor Device with Vertical Resistor," (April 1969)

Seelbach et al,, South African Patent Journal, July 1968, page 119; Application for " Voltage Distribution System for Integrated Circuits"

*Primary Examiner*—John W. Huckert
*Assistant Examiner*—William D. Larkins
*Attorney*—Spensley, Horn & Lubitz

ABSTRACT: Electrical resistor of semiconductor material formed in the thickness dimension of a high-resistivity substrate underlying an epitaxial layer of the same conductivity-type. A region of the opposite conductivity-type in the substrate, contiguous with the epitaxial layer, extends laterally across all but a predetermined area of the substrate in conjunction with the resistivity of the substrate material determining the resistance value of the resistor. Semiconductor devices and other circuit elements may be formed in the epitaxial layer in accordance with known techniques, the resistor being in series with any desired ones of the additional elements.

GORDON E. MOORE
INVENTOR.

BY Spensley & Horn
ATTORNEYS

RESISTOR FOR INTEGRATED CIRCUIT

BACKGROUND OF THE INVENTION

1. Field of the Invention

This invention relates to resistors for integrated circuits.

2. Prior Art

In accordance with modern space age requirements the trend in the semiconductor industry has been toward integrated circuitry in which several circuit elements, including at least one semiconductor device, are built into a body of semiconductor material, thereby achieving a substantial reduction in size and weight. However, it has been heretofore quite difficult to form integrated circuit resistors of a small size comparable to that of the semiconductor devices in the circuitry. The typical prior art techniques for forming integrated circuit resistors generally involve a diffused line of a tortuous path with contact made to the two ends, or the application of a thin resistive film atop insulative coatings on the semiconductor body. In either case, these prior art resistors occupy areas which are usually significantly larger than the active devices in the circuit, particularly when high-resistance values are required. In such integrated circuit constructions the use of complex interconnection patterns on the substrate surface results in a scarcity of surface area. Thus, there is very little surface area available for resistors.

The present invention is directed toward an improved integrated circuit resistor wherein the resistor is formed in the thickness dimension of the substrate, unlike the prior art resistors which extend laterally of the substrate and adjacent the interconnection area.

BRIEF DESCRIPTION OF THE INVENTION

The present invention integrated circuit resistor is formed in the thickness dimension of a high-resistivity substrate. The resistor is formed in the substrate prior to the epitaxial layer growth by the diffusion of an impurity of an opposite conductivity type into all but a predetermined masked or covered area of the substrate upper surface. The dimensions of the masked area and the depth of the diffusion in conjunction with the resistivity of the substrate material determine the resistance value of the resistor. Subsequent growth of the epitaxial layer enables the formation therein and thereon of semiconductor devices and other circuit elements, using known techniques. Ohmic contact to the underside of the substrate establishes electrical connection to one end of the resistor the other end of the resistor being integral with the epitaxial layer. Thus, if the epitaxial layer is utilized as the collector of a transistor formed therein, the source voltage, $V_{cc}$, can be connected to the substrate, the integral resistor forming the load resistor and the basis for distributing power.

Thus, the resistor structure occupying no substrates surface areas, involves no increase in lateral dimensions and, equally important, no increase in lateral dimensions is involved in the making of an electrical connection (for power distribution) to the resistor since ohmic contact is made to the substrate lower surface and to the epitaxial layer. Not only does the present invention resistor structure enable significant reductions in integrated circuit size, but it also involves no interaction or compromise with the processes used in formation of the active circuit elements. For example, the conventional diffused resistor is formed in the same operation which forms the base element of the associated transistor, thereby usually requiring a compromise in order to achieve desirable characteristics for both the resistor and the transistor, and generally resulting in less than an optimum solution for either. The present invention resistor, on the other hand, is formed prior to growth of the epitaxial layer and formation of the other circuit elements, and is compatible with any of the generally employed semiconductor structures, with the exception of dielectric isolation types of integrated structure.

DESCRIPTION OF THE PREFERRED EMBODIMENT

Figure 1A:
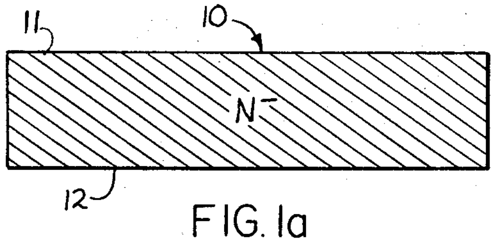
FIGS. 1*a*–1*h* are elevation views, in section, of a semiconductor crystal substrate in various stages of fabrication of an integrated circuit resistor; and, FIG. 2 is an elevation view, in section, of a portion of an integrated circuit incorporating the resistor of FIG. 1.

Turning now to the drawing, there is shown in FIG. 1*a* a monocrystalline silicon substrate, generally indicated by the reference numeral 10 and having an upper surface 11 and a lower surface 12. In the illustrative embodiment the substrate is of high-resistivity $N^-$-type semiconductor material, the resistivity of the material being chosen in accordance with the desired resistance value of the resistor to be formed as will be hereinbelow explained.

Figure 1B:
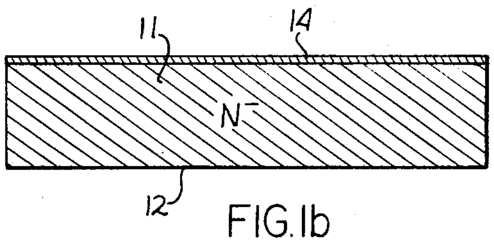

In order to form a pattern of impurities on the substrate 10, the upper surface 11 is masked with a material resistant to diffusion, such as a silicon dioxide layer 14 for example, the substrate then appearing as shown in FIG. 1*b*.

Figure 1C:
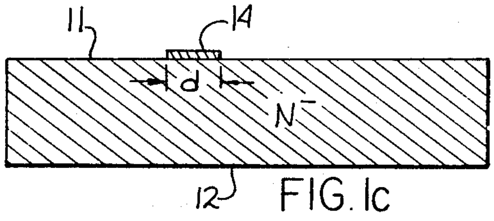

It is desired to form an impurity pattern which extends across all but a predetermined area or areas of the substrate, the predetermined area being a circular region of diameter *d* (FIG. 1*c*). Accordingly, the appropriate portions of oxide layer 14 are removed by photoengraving processes known in the art, leaving the desired region as indicated in FIG. 1*c* which may take any of numerous geometrical configurations (e.g., circular, square, etc.).

Figure 1D:
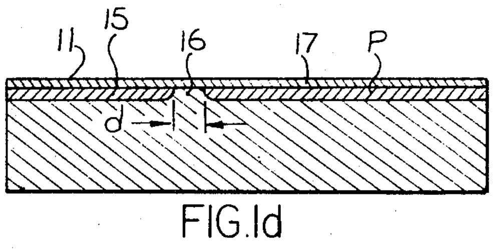

Next, the upper surface of the substrate is subjected to a gaseous atmosphere containing the desired impurities, these impurities diffusing into the unmasked portion of substrate upper surface 11. In the illustrated embodiment, the desired impurities are of a $P^-$-type conductivity such as boron, for example, to form a separation region 15 surrounding a circular $N^-$-region 16 in the substrate material underlying the oxide mask. The diffusion time and depth depend upon the resistivity and depth of the pattern desired. The use of this method of forming the impurity pattern, however, is not essential to the invention. Alternatively, the impurity pattern may be deposited on the substrate in any manner as by painting or spraying a slurry or mixture containing the impurity element or its oxides. A second oxide layer 17 is established on the substrate upper surface, the diffused substrate then appearing as shown in FIG. 1*d*.

Figure 1E:
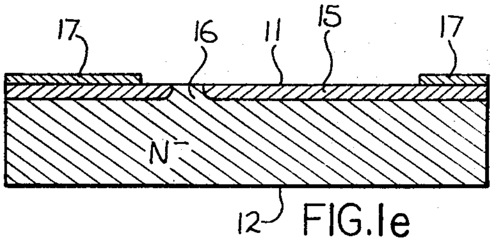
Figure 1F:
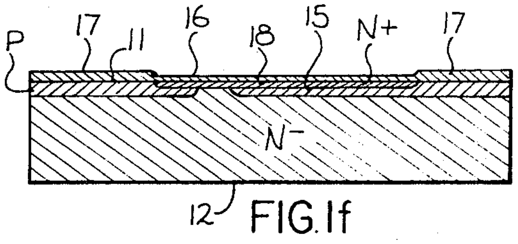

Then, a central portion of oxide layer 17 is removed, exposing that portion of the substrate upper surface 11 containing circular region 16, as indicated in FIG. 1*e*, again using standard photoengraving techniques. The thus exposed area of upper surface 11 of substrate 10 is subjected to a diffusion step in which active impurity atoms of N-type conductivity are diffused to form a highly doped $N^+$-region 18, the substrate then appearing as shown in FIG. 1*f*. This highly doped region is commonly referred to as a buried layer and while advantageous in many constructions it is not essential to the invention.

Figure 1G:
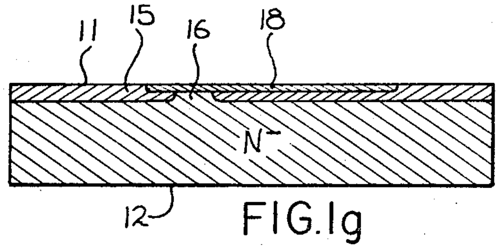

Next, the remaining portion of oxide layer 17 is stripped away, as indicated in FIG. 1*g*. Finally, an epitaxial layer 20 is formed on the substrate 10 and regions 15 and 18. Various methods of forming epitaxial layers are now well known in the art, such as those described in Hunter, L. P., Handbook of Semiconductor Electronics, 2nd ed., Subchapter 7.11 (York, Pennsylvania, 1962).

Figure 1H:
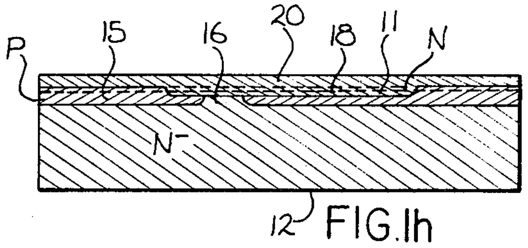

Referring to FIG. 1*h*, the time and temperature used in the growth of the epitaxial layer 20 are such that some of the impurities from doped regions 15 and 18 diffuse into the epitaxial layer while it is being grown; hence the original upper surface 11 of the substrate is indicated by a dashed line, the doped regions 15 and 18 appearing somewhat thicker. The epitaxial layer 20 is of N-type conductivity. The now buried $N^+$ layer 18 being sandwiched between N-type epitaxial layer 20 and $N^-$-type region 16 of substrate 10. Central circular region 16 of diameter *d* forms the desired resistor, electrical connection thereto being integrally formed by the substrate material 10 at one end and by the epitaxial layer 20 and $N^+$ buried region 18 at the other end. The resistance value of the resistor is determined by the resistivity of the substrate material in conjunction with the area and length of central region 16. In accordance with known mathematical relationships, the resistance varies directly with material resistivity and length and inversely with cross-sectional area (proportional to $d^2$ in the illustrated embodiment wherein region 16 is of circular cross section with diameter *d*).

Figure 2:
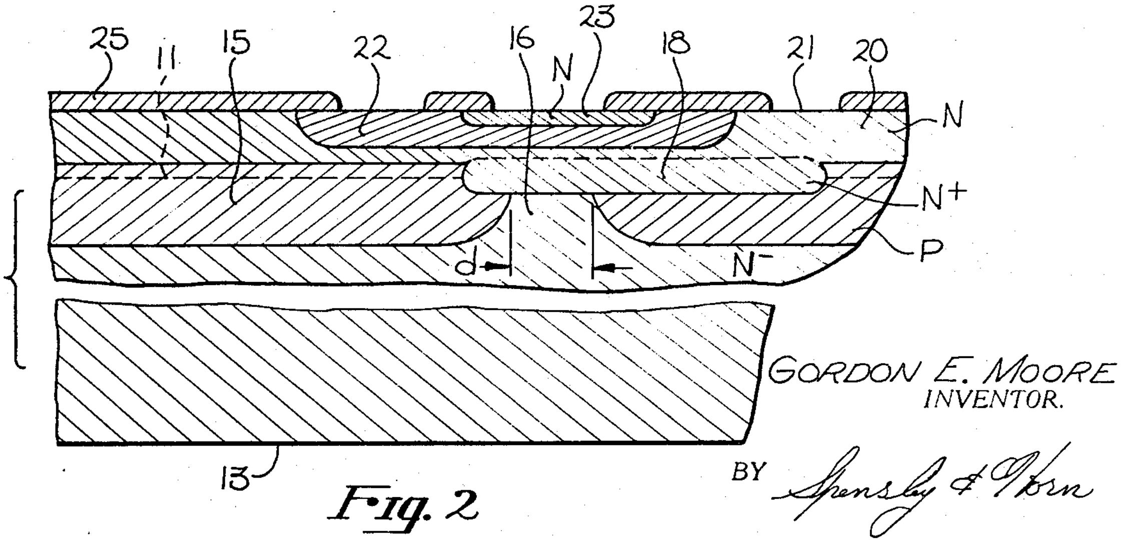

The illustrated resistor configuration is ideally suited for use in integrated circuitry, as indicated in FIG. 2, wherein epitaxial layer 20 forms the collector element of a transistor. Into the upper surface 21 of epitaxial layer 20 are diffused first a region 22 of P-type conductivity forming the transistor base element, and then a highly doped $N^+$ island region 23, to a shallower depth within region 22, forming the transistor emitter element. A suitable pattern 25 of a passivating material is established on the upper surface 21 to protect the junction terminations, and to allow areas of the regions 22 and 23, as well as of epitaxial layer 20, to remain exposed for the making of electrical connection thereto.

The lower surface 12 of the substrate 10 can be metallized with a thin layer 13 of suitable electrically conductive material to create an ohmic contact for connection to the transistor supply voltage source, $V_{cc}$. The integral resistor formed by region 16 in the substrate provides the function of a load resistor, the remaining portion of the substrate bulk material forming a spreading resistor terminating in a broad area electrical contact at layer 13. The $N^+$ layer 18 provides the desired ohmic contact between the epitaxial layer 20 and the resistor at region 16.

The formation of the transistor, or other desired circuit elements, within and upon the epitaxial layer is in accordance with known techniques and any type of integrated circuitry should be compatible with the desired use of the integral resistor formed by substrate region 16 and the underlying substrate material. One area of significant utility for the invention resides in applications wherein it is desirable to connect the integrated circuit to a power supply through a large resistor value that need not be of especially great precision. A particularly important application of the present invention resistor structure is envisioned for bipolar semiconductor memory cells wherein it is desirable to achieve large resistance values but where the space required for conventional resistor structures would make the cost of the cells so high as to render them noncompetitive with other technologies. For example, utilizing the present invention resistor structure it is possible to lay out a bipolar memory cell with a cross-sectional area on the order of 20 square mils, as compared with a cross-sectional area of about 50 square mils which would be required when utilizing conventional techniques for forming the resistor, in which conventional techniques masking tolerances would be a determining factor.

Thus there has been described a novel resistor structure for integrated circuits in which a high-resistance value is achieved with a minimum area, thereby facilitating a significant decrease in circuit size and cost, and in which utilization of the substrate connection as a power supply lead renders unnecessary use of a distributional metal grid on the upper surface of the device. Although the invention has been described with a certain degree of particularily, it is understood that the present disclosure has been made only by way of example and that numerous changes in the details of the circuitry with which the present invention techniques can be utilized may be resorted to without departing from the spirit and scope of the invention as defined by the claims. For example, a substrate of P-conductivity-type silicon or other semiconductor material could be used in applications wherein it is desired to provide a load resistor for a PNP transistor or other circuit element wherein the resistor is to be integrally connected to a P-conductivity-type region.

I claim:

1. An electrical resistor for an integrated circuit comprising a body of semiconductor material including;

a. a substrate of one conductivity-type material of a predetermined relatively high resistivity;

b. a separation region of the opposite conductivity type extending laterally across all but at least one predetermined region of said substrate, said separation region in conjunction with said substrate defining said predetermined region, the area and depth of which in conjunction with the resistivity thereof substantially determining the resistance value of said resistor wherein the resistance value of said resistor is approximately proportional to the depth of said predetermined region.

c. a layer of said one conductivity type and of a relatively low resistivity deposited over said separation region; and d. means for establishing electrical connection to said substrate and to said layer.

2. An electrical resistor according to claim 1, further including a high-conductivity region of said one conductivity type interposed between said predetermined region and said layer, the resistivity of said high-conductivity region being lower than that of said layer.

3. Electrical resistor according to claim 2 wherein said high-conductivity region is of a greater lateral extent than said predetermined region.

4. An integrated circuit having a semiconductor device and a resistor, comprising a body of semiconductor material including;

a. a substrate of one conductivity-type material of a predetermined relatively high resistivity;

b. an epitaxial layer of said one conductivity type and of a relatively low resistivity deposited upon said substrate;

c. a separation region of the opposite conductivity type in said substrate contiguous with said epitaxial layer and extending laterally across all but a predetermined region of said substrate, said separation region in conjunction with said substrate defining said predetermined region the area and depth of which in conjunction with the predetermined resistivity thereof determining the resistance value of said resistor, wherein the resistance value of said resistor is approximately proportional to the depth of said predetermined region;

d. a second region of said opposite conductivity-type inset into said epitaxial layer and sharing a common upper surface therewith; and, e. means for establishing electrical contact to said second region and to said substrate.

5. Integrated circuit according to claim 4, further including means for establishing electrical contact to said epitaxial layer.

6. Integrated circuit according to claim 5, wherein said second region is a base region and said epitaxial layer forms a collector region, and further including an emitter region of said one conductivity type inset into said base region and sharing a common upper surface therewith.

7. Integrated circuit according to claim 4 further including a high-conductivity region of said one conductivity type interposed between said predetermined region of said substrate and said epitaxial layer, the resistivity of said high-conductivity layer being lower than that of said epitaxial layer.

8. Integrated circuit according to claim 7, wherein said high-conductivity region is of greater lateral extent than said predetermined region.

9. Integrated circuit according to claim 6, further including means for establishing electrical contact to said substrate and to said base, emitter and collector regions.

* * * * *